(12) United States Patent
Carlborg et al.

(10) Patent No.: US 8,927,664 B2
(45) Date of Patent: Jan. 6, 2015

(54) METHOD FOR THE MANUFACTURE OF ARTICLES OF THIOL-ENE POLYMERS

(75) Inventors: Carl Fredrik Carlborg, Stockholm (SE); Tommy Haraldsson, Järfälla (SE); Kim Öberg, Stockholm (SE); Michael Malkoch, Täby (SE)

(73) Assignee: Mercene Labs AB (SE)

( * ) Notice: Subject to any disclaimer, the term of this patent is extended or adjusted under 35 U.S.C. 154(b) by 0 days.

(21) Appl. No.: 13/876,583

(22) PCT Filed: Oct. 3, 2011

(86) PCT No.: PCT/EP2011/067228
§ 371 (c)(1),
(2), (4) Date: Jun. 3, 2013

(87) PCT Pub. No.: WO2012/042059
PCT Pub. Date: Apr. 5, 2012

(65) Prior Publication Data
US 2013/0331528 A1    Dec. 12, 2013

(30) Foreign Application Priority Data
Oct. 1, 2010    (SE) ...................... 1000972

(51) Int. Cl.
| | | |
|---|---|---|
| *C08G 75/04* | (2006.01) | |
| *C08G 77/392* | (2006.01) | |
| *B81C 3/00* | (2006.01) | |
| *C09D 181/02* | (2006.01) | |

(52) U.S. Cl.
CPC .............. *C08G 77/392* (2013.01); *B81C 3/001* (2013.01); *C09D 181/02* (2013.01); *C08G 75/045* (2013.01); *B81B 2201/058* (2013.01); *B81B 2201/06* (2013.01)
USPC ....................................................... 525/535

(58) Field of Classification Search
USPC .......... 525/477, 535; 264/401, 405, 446, 447, 264/494, 250, 251, 254, 259, 294, 308, 233, 264/344, 113; 425/174.4
See application file for complete search history.

(56) References Cited

U.S. PATENT DOCUMENTS

| | | | |
|---|---|---|---|
| 3,697,396 A | 10/1972 | Kehr et al. | |
| 7,521,015 B2 | 4/2009 | Cheng et al. | |
| 2006/0066006 A1* | 3/2006 | Haraldsson et al. | .......... 264/255 |
| 2007/0021521 A1 | 1/2007 | Cheng et al. | |
| 2009/0096136 A1* | 4/2009 | Hawker et al. | ................ 264/483 |

FOREIGN PATENT DOCUMENTS

CN        101228190 A    7/2008

OTHER PUBLICATIONS

Carlborg et al ("Beyond PDMS: off-stoichiometry thiol-ene (OSTE) based soft lithography for rapid prototyping of microfluidic devices", Lab Chip, 2011, 11,p. 3136-3147, Aug. 1, 2011).*
Ashley et al., Lab Chip, 2011, 11, 2772-2778.
Bartolo et al., Lab Chip 2008, 8, 274.
Belfield et al. ACS Symposium series 2003, 65.
Carioscia et al., Polymer 2007, 48, 1526-1532.
International Preliminary Report on Patentability for Application No. PCT/EP2011/067228 dated Apr. 2, 2013.
Khire et al., "Formation and Surface Modification of Nanopatterned Thiol-ene Substrates Using Step and Flash Imprint Lithography", Advanced Materials, Sep. 3, 2008, 20:17, 3308-3313.

* cited by examiner

*Primary Examiner* — Randy Gulakowski
*Assistant Examiner* — Christopher M Rodd
(74) *Attorney, Agent, or Firm* — Lerner, David, Littenberg, Krumholz & Mentlik, LLP

(57) ABSTRACT

A method for the manufacture of articles of thiol-ene polymers comprises the steps: a) reacting a compound comprising at least two thiol groups and a compound comprising at least two carbon-carbon double bonds, in off stochiometry ratios to obtain a first intermediate article, wherein said first intermediate article comprises at least one unreacted group selected from an unreacted thiol group and an unreacted carbon-carbon double bond, and b) contacting said first intermediate article with a second article, wherein the surface of said second article at least partially comprises reactive groups and reacting at least a part of said unreacted groups on said first intermediate article with chemical groups on said second article to obtain covalent bonds and forming a final article.

19 Claims, 4 Drawing Sheets

Fig 2 a)
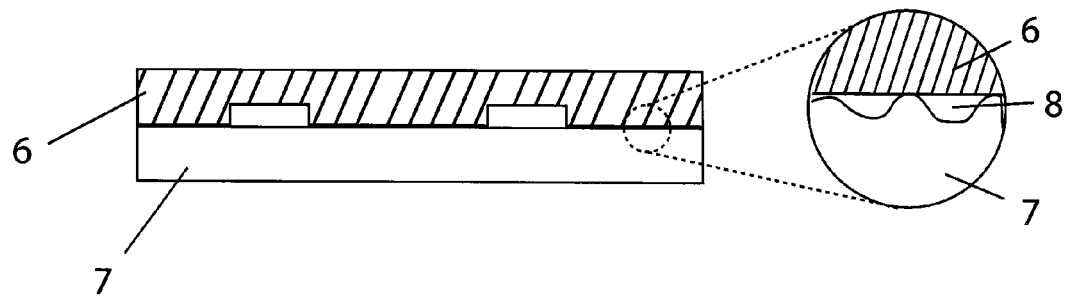
Fig 2 b)
Fig 2 c)
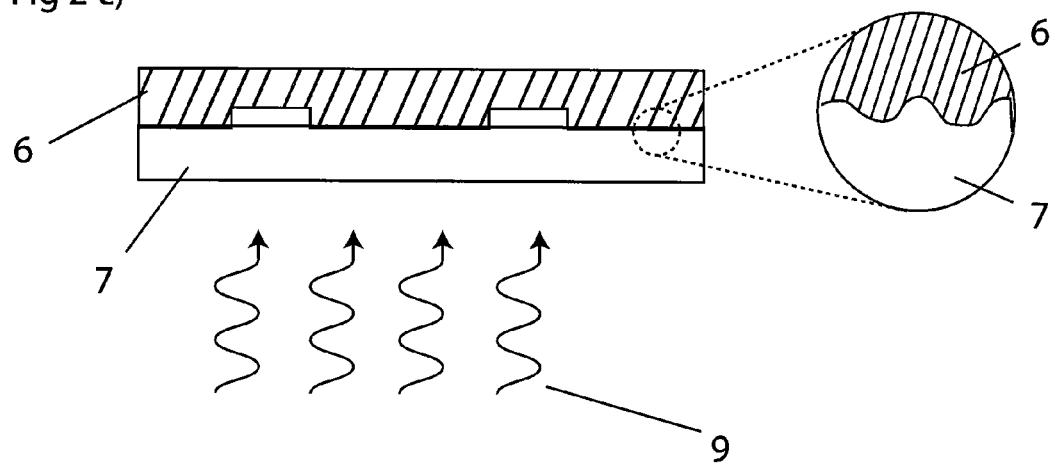
Fig 2 d)
Fig 2 e)
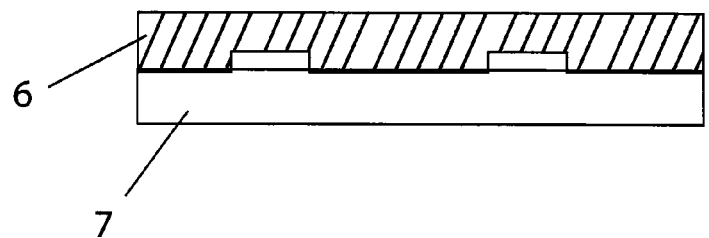

METHOD FOR THE MANUFACTURE OF ARTICLES OF THIOL-ENE POLYMERS

CROSS-REFERENCE TO RELATED APPLICATIONS

The present application is a national phase entry under 35 U.S.C. §371 of International Application No. PCT/EP2011/067228 filed Oct. 3, 2011, published in English, which claims priority from Swedish Application No. 1000972-8 filed Oct. 1, 2010 all of which are incorporated herein by reference.

TECHNICAL FIELD

The present invention relates generally to the manufacture of articles made from off stochiometry thiol-ene (OSTE) polymers. It also relates to articles made by the method.

BACKGROUND

In the prior art regarding assembly and bonding of multilayer polymer or hybrid articles that consist of polymers and inorganic materials, there is a problem with bonding the individual layers at a low temperature and solvent free conditions. The problems of bonding such articles are compounded by incorporating patterns on one or more of the layers since liquids, such as glue, tend to wick into cavities, altering the desired geometries.

In the prior art regarding polymer articles there is a problem with binding to a biofunctionalised substrate: Many biosensors require a microfluidic channel layer to distribute, separate or mix the sample before detection and to improve the mass transport of analyte down to the sensor surface. Polymers are the most commonly used material for microfluidics due to its low cost, ease of manufacture and tailorable surfaces. However, bonding a plastic substrate to a biofunctionalised surface remains a problem. Heat, solvents or oxygen plasma treatment, that is often used to activate the surfaces prior to bonding, destroys the biofunctionalization. Moreover, two stiff substrates cannot form a perfect seal and react with each other if they are not perfectly smooth on a molecular level. Clamping of microfluidic devices made from rubberry materials is only possible for simple channel geometries due to deformation of the material under pressure, which may lead to leakage and altered fluidic behavior.

In microfluidic devices with closed channels there is the problem to functionalize the closed micro channels: Surface functionalisation of microfluidic channels is essential for controlling the liquid flow, for preventing unspecific binding of analytes and for attaching biomolecules. Currently used polymers must first be surface activated before functional molecules can be attached. Typically, traditional plasma treatment does not give a homogeneous surface coverage and the density of modifications cannot be controlled. Further, thermoplastics activated via hydrogen abstraction from light activated compounds such as benzophenone suffer from low density surface coverage.

Regarding for instance closed microfluidic systems there is the problem to assemble the microfluidic devices: Microfluidic devices typically consist of several bonded micropatterned polymeric layers. The bonding of these layers can be complicated and require heating, plasma treatment, ultrasonic welding or treatment with solvents.

In the art, off stoichiometry has long been well known and one patent describing thiol-ene polymers (U.S. Pat. No. 3,697,396) claims significantly off-stoichiometric mixtures, 0.5/1 to 2/1 ene to thiol ratio, and gives examples of materials fabricated via significant off stoichiometry and reports curing time and shore hardness of said materials. Single shaped molded cast articles from thiol-enes are claimed, while micropatterning and assembly of articles from separately fabricated thiol-ene pieces are not mentioned.

Off stoichiometric formulations have been previously described in the art. In a work by Khire et al. (Adv. Mater. 2008, 20, 3308-3313), very thin nanopatterned off stochiometry thiol-ene films were fabricated using a nanopatterned PDMS stamp. The prepolymer contained a small excess of thiols and the thiol groups present on the polymer surface after the polymerization was utilized for subsequent surface modification via a grafting-to process. Off stoichiometry was also used to control the thickness of the grafted layer where, by adjusting the thiol to ene ratio, oligomers of a predetermined average size where polymerized in bulk and attached to the thiol excess polymer surface. While off stoichiometric formulations have been known in the art and sometimes are used, no systematic investigation into the properties of off-stoichiometric formulations have been performed. On the contrary, it is often argued that off-stoichiometry results in very poor mechanical properties, and should be avoided, (Belfield et al. ACS symposium series 2003, p 65). The reasons for this are twofold: firstly deviation from stoichiometry results in a non-optimized polymeric network with less than the maximum number of crosslinks and the inclusion of dangling chain ends; and secondly, there is a finite risk that monomers are left unreacted in the network, thus risking leaching into the environment.

Ternary prepolymer formulations have been previously described in the art. Carioscia et al. (J. A. Carioscia et al., Polymer 48, (2007) 1526-1532) described the cure kinetics and Tg of a ternary prepolymer formulation consisting of a thiol an allyl and an epoxy monomer. In the mixture there was also added a radical initiator and anionic initiator. While good ultimate mechanical properties were achieved, no attempt to temporally separate the dual cure events to utilize the inherent reactivity after an initial cure was attempted nor was such a strategy suggested.

For micropatterning of polymers, commercial as well as in-house thiol-ene formulations using both molding and direct photolithography have been described in the art. In (D. Bartolo, et al, *Lab Chip*, 2008, 8, 274) a method utilizing NOA 81, a commercially available thiol-ene based UV-curable glue, was shown to result in microfluidic devices, with adequate mechanical and bulk materials properties. Also good bonding to a substrate was shown upon renewed polymerization of an oxygen inhibited uncured polymer layer situated on the bottom of the device. Furthermore, it was claimed that oxygen inhibition, due to the high gas permeability of the PDMS mold, was effective for creating a layer of unreacted prepolymer on the channel surfaces, which is useful for subsequent surface modifications. In another example (J. Ashley et al. Lab Chip, 2011, 11, 2772-2778), a freeform UV-curable photolithographic technology using thiol-enes was shown. Uniquely, the propensity for unwanted cure in shadow regions exhibited by thiol-enes, due to the high mobility of radicals and low propensity for inhibition, was hindered by a large amount of inhibitor added to the mixture.

While off stoichiometric formulations have been used in at least one instance for surface modification of nanopatterned materials, no technology describing free standing polymeric structures from off stoichiometric monomer mixtures has been disclosed. The technologies and materials presented above therefore are almost exclusively incompatible which prevents simple process and materials combinations to achieve mass fabrication of micropatterned polymeric articles. While many of these processes may be suitable for the particular purpose which they address, they are not as suitable for cost beneficial fabrication of polymeric micro-patterned articles with superior surface modification, facile bonding and easy patternability via molding and/or potolithography.

In these respects, the materials and their fabrication process that enables the fabrication of microfluidic devices with on-board connections between the everyday world to microfluidic channels and minute reaction chambers, durable surface properties that prevent analyte adsorption and robust enclosure of channels according to the present invention substantially departs from the conventional concepts and designs of the prior art, and in so doing provides microfluidic devices with hitherto unrealized usability and economies of scale.

SUMMARY

It is an object of the present invention to obviate at least some of the disadvantages in the prior art and provide an improved method to manufacture articles made from off stochiometry thiol-ene (OSTE) polymers.

In a first aspect there is provided a method for the manufacture of an article, said method comprising the steps of: a) reacting a compound comprising at least two thiol groups and a compound comprising at least two carbon-carbon double bonds, with the proviso that the ratio (r1) in the reaction mixture between the number of thiol groups and the number of carbon-carbon double bonds fulfils one of: $0.5 \leq r1 \leq 0.9$ and $1.1 \leq r1 \leq 2$, to obtain a first intermediate article, wherein said first intermediate article comprises at least one unreacted group selected from an unreacted thiol group and an unreacted carbon-carbon double bond, and b) contacting said first intermediate article with a second article, wherein the surface of said second article at least partially comprises at least one chemical moiety selected from a thiol, and an electron deficient olefin for $0.5 \leq r1 \leq 0.9$ and at least one chemical moiety selected from vinyl, norbornene, allyl, alkene, alkyne, epoxy, isocyanate, N-hydroxy succinimide-groups, bromoacetyl, iodoacetyl, pyridyldisulfide, gold, platinum and silver for $1.1 \leq r1 \leq 2$ and reacting at least a part of said unreacted groups on said first intermediate article with chemical groups on said second article to obtain covalent bonds and forming a final article.

In a second aspect there is provided an article manufactured by reacting a compound comprising at least two thiol groups and a compound comprising at least two carbon-carbon double bonds, with the proviso that the ratio (r1) in the reaction mixture between the number of thiol groups and the number of carbon-carbon double bonds fulfils one of: $0.5 \leq r1 \leq 0.9$ and $1.1 \leq r1 \leq 2$, to obtain a first intermediate article, wherein said first intermediate article comprises at least one unreacted group selected from an unreacted thiol group and an unreacted carbon-carbon double bond, and subsequently contacting said first intermediate article with a second article, wherein the surface of said second article at least partially comprises at least one chemical moiety selected from a thiol, and an electron deficient olefin for $0.5 \leq r1 \leq 0.9$ and at least one chemical moiety selected from vinyl, norbornene, allyl, alkene, alkyne, epoxy, isocyanate, N-hydroxy succinimide-groups, bromoacetyl, iodoacetyl, pyridyldisulfide, gold, platinum and silver for $1.1 \leq r1 \leq 2$ and reacting at least a part of said unreacted groups on said first intermediate article with chemical groups on said second article to obtain covalent bonds and forming a final article.

Further aspects and embodiments are defined in the appended claims, which are specifically incorporated herein by reference.

A microfluidic layer manufactured of the OSTE-polymer offers unique advantages for bonding to biofunctionalised surface compared to the prior art.

A) The reactive groups present on the surface (for instance thiols, epoxies or ene) of the OSTE polymers after the curing process can directly react with many common bio-linker molecules and their residues, including but not limited to isocyanates, epoxy, amines, alcohols, N-hydroxy succinimide-groups maleimides, haloacetyl (Bromo- or Iodo-) and pyridyldisulfide to form covalent bonds, thus avoiding the surface activation step.

B) The OSTE mechanical properties can be temperature-tuned in a narrow interval. For example, depending on the stoichiometric ratio, the OSTE-polymer can be very stiff (>1 GPa) at 25° C. but soften sufficiently (<10 MPa) at 37° C. (biocompatible temperature) to be able to conform perfectly to microirregularities of stiff substrates and maximize the bond formation yield. Moreover, when the OSTE-polymer has cooled down to 25° C., it reverts to its stiff state and the bonding is improved due to mechanical interlocking with surface irregularities.

A microfluidic layer fabricated in the OSTE polymers further offers distinct advantages: A) The reactive groups present on the surface of the OSTE polymer after curing process provide a controllable density of chemical anchors for direct, covalent surface modification. The surface groups are distributed homogeneously over the surface and the density can be controlled by the amount of off-stoichiometry. B) The surface modification via the thiol and allyl anchors can easily be controlled by UV-initiation and a stencil mask can be used to pattern surface modifications precisely in desired locations.

Yet another advantage is that the OSTE polymers can be directly and covalently "dry" bonded to each other without using plasma, solvents or liquid glues. The unreacted groups on the surface of the OSTE polymers can covalently react with other OSTE-polymer layers. For example, an OSTE layer with an excess of thiol groups can react to form covalent bonds to an OSTE layer with excess of ene groups by an additional UV cure. As the mechanical properties of the OSTE polymers can be temperature tuned, they can be softened to conform perfectly to each other when heated thus enabling perfect bond yield.

BRIEF DESCRIPTION OF THE DRAWINGS

The invention is now described, by way of example, with reference to the accompanying drawings, in which:

FIG. 2 a) schematically illustrates the bonding process where two polymer articles (6) and (7) of which one or two may be patterned to create enclosed compartments or channels. The articles (6) and (7) have exposed thiol, and/or allyl and/or epoxy groups on their surfaces. If the articles are stiff and the surfaces not perfectly smooth the interface may look like the zoom-in of the interface shown in FIG. 2 b) with nano- or micro scale roughness creating unwanted voids in the interface (8) that decreases the contact area and result in a low bond yield. In FIG. 2c) the laminated articles may be heated (9) to soften at least one of them and make the articles conform perfectly to the nano- and micro irregularities of the surfaces as illustrated in FIG. 2 d), where the voids (8) are gone and the polymer articles (6) and (7) are in complete contact. During the heating the surface groups may react with each other to form a covalent bond. An additional actinic radiation (4) step may be required to covalently react the surface groups to each other as illustrated in FIG. 2 e).

In FIG. 3 c), the laminated polymer article (6) and substrate (10) may be heated (9) to soften the polymer article and make the articles conform perfectly to the nano- and micro irregularities of the surfaces as illustrated in FIG. 3 d), where the voids (8) are gone and the polymer articles (6) and (7) are in complete contact. During the heating the surface groups may react with the groups on the surface to form covalent bonds. An additional actinic radiation step (4) may be required to covalently react the surface groups to each other as illustrated in FIG. 3 e).

DETAILED DESCRIPTION

Figure 1:
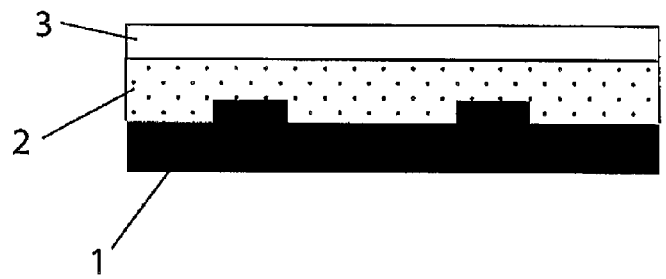
FIG. 1 a) schematically illustrates an example of fabrication method of the polymer articles. A liquid prepolymer (2) consisting of monomers that is applied to a substrate of for example silicon, copper, aluminum, polymer that may contain patterned features to be replicated into the polymer and may be coated with hydrophobic release coating. A top plate (3) may be applied to planarise the surface of the prepolymer. The prepolymer (2) is subsequently polymerised either, as in FIG. 1 b) using actinic radiation from an external source (4) or as in FIG. 1 c) using thermal energy (5). Finally, FIG. 1 d) illustrate the removal of the top plate (3) and the bottom substrate (2) from the now polymerised article (6).
Figure 1:
Figure 1:
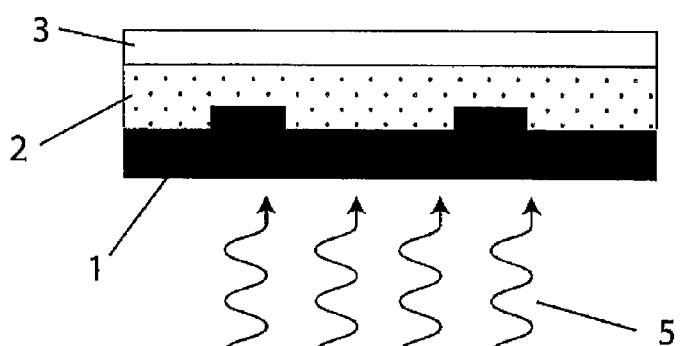
Figure 1:
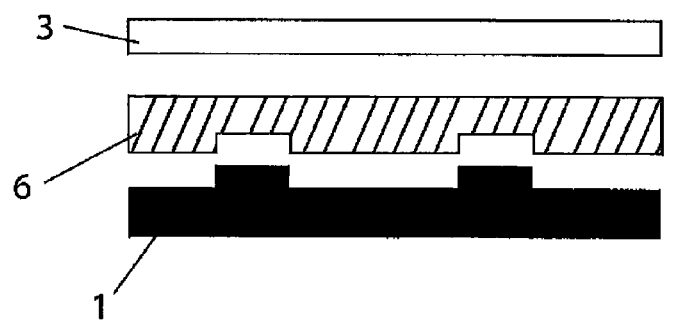
Figure 3:
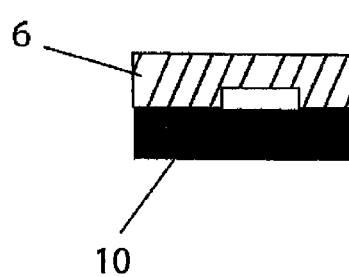
FIG. 3 a-e) schematically illustrates the bonding process where one polymer article which may be patterned (6) and exposing thiol and/or allyl and/or epoxy groups is bonded to a substrate (10) for example a microarray surface, sensor surface, or any metal, polymer, silicon or glass. The substrate (10) may have a surface coating. If the polymer article (6) and substrate (10) are stiff and the surfaces not perfectly smooth the interface may look like the zoom-in of the interface shown in FIG. 3 b) with nano- or micro scale roughness creating unwanted voids in the interface (8) that decreases the contact area and result in a low bond yield.
Figure 3:
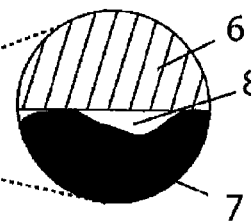
Figure 3:
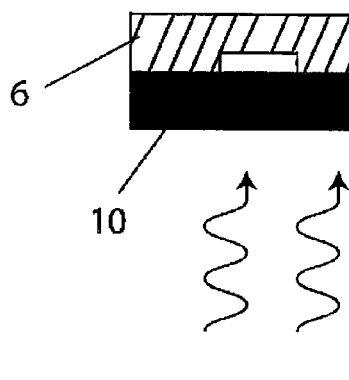
Figure 3:
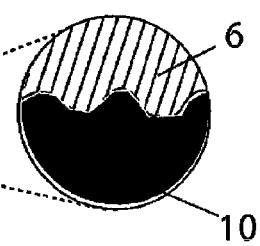
Figure 3:
Figure 3:
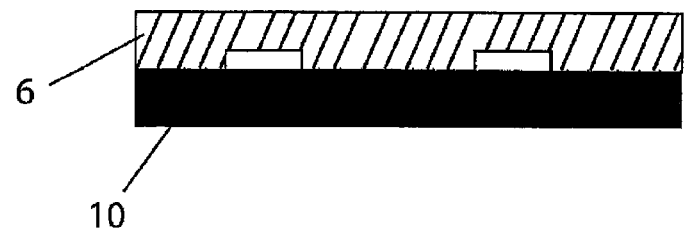
Figure 4:
In FIG. 4 the surface patterning process is schematically illustrated. A liquid containing functionalised molecules (11) that can react with the surface groups of the article is applied on the polymer article (6). Actinic radiation filtered through a stencil mask (12) is placed in between the actinic radiation source (4). Surface reactions between the molecules or monomers in solution can only occur in the areas expose to the radiation.
Figure 4:
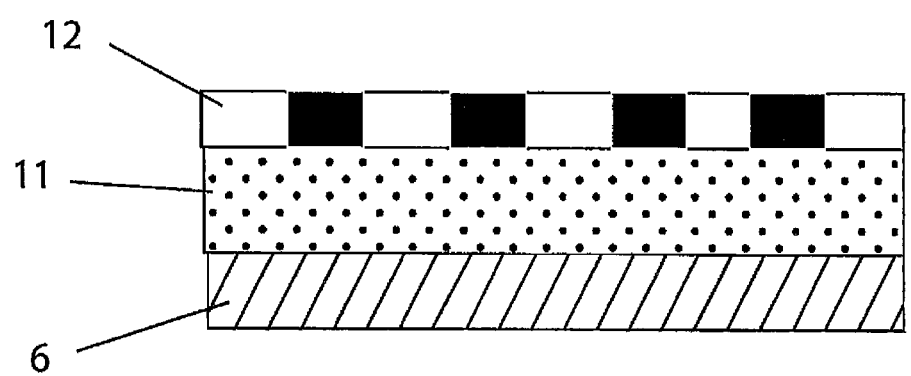

Before the invention is disclosed and described in detail, it is to be understood that this invention is not limited to particular compounds, configurations, method steps, substrates, and materials disclosed herein as such compounds, configurations, method steps, substrates, and materials may vary somewhat. It is also to be understood that the terminology employed herein is used for the purpose of describing particular embodiments only and is not intended to be limiting since the scope of the present invention is limited only by the appended claims and equivalents thereof.

It must be noted that, as used in this specification and the appended claims, the singular forms "a", "an" and "the" include plural referents unless the context clearly dictates otherwise.

If nothing else is defined, any terms and scientific terminology used herein are intended to have the meanings commonly understood by those of skill in the art to which this invention pertains.

The term "about" as used in connection with a numerical value throughout the description and the claims denotes an interval of accuracy, familiar and acceptable to a person skilled in the art. Said interval is ±10%.

In a first aspect there is provided a method for the manufacture of an article, said method comprising the steps of: a) reacting a compound comprising at least two thiol groups and a compound comprising at least two carbon-carbon double bonds, with the proviso that the ratio (r1) in the reaction mixture between the number of thiol groups and the number of carbon-carbon double bonds fulfils one of: $0.5 \leq r1 \leq 0.9$ and $1.1 \leq r1 \leq 2$, to obtain a first intermediate article, wherein said first intermediate article comprises at least one unreacted group selected from an unreacted thiol group and an unreacted carbon-carbon double bond, and b) contacting said first intermediate article with a second article, wherein the surface of said second article at least partially comprises at least one chemical moiety selected from a thiol, and an electron deficient olefin for $0.5 \leq r1 \leq 0.9$ and at least one chemical moiety selected from vinyl, norbornene, allyl, alkene, alkyne, epoxy, isocyanate, N-hydroxy succinimide-groups, bromoacetyl, iodoacetyl, pyridyldisulfide, gold, platinum and silver for $1.1 \leq r1 \leq 2$ and reacting at least a part of said unreacted groups on said first intermediate article with chemical groups on said second article to obtain covalent bonds and forming a final article.

In one embodiment the second article is manufactured by reacting a compound comprising at least two thiol groups and a compound comprising at least two carbon-carbon double bonds, with the proviso that the ratio (r2) in the reaction mixture between the number of thiol groups and the number of carbon-carbon double bonds fulfils one of: for $0.5 \leq r1 \leq 0.9$ r2 fulfills: $1.1 \leq r2 \leq 2$ and for $1.1 \leq r1 \leq 2$ r2 fulfills: $0.5 \leq r2 \leq 0.9$, to obtain said second article comprising at least one unreacted group selected from an unreacted thiol group and an unreacted carbon-carbon double bond.

In alternative embodiment r1 fulfills $0.5 \leq r1 \leq 0.7$ and $1.4 \leq r1 \leq 2$.

In yet alternative embodiment r1 fulfills $0.4 \leq r1 \leq 0.5$ and $2 \leq r1 \leq 2.5$.

In one embodiment said electron deficient olefin in step b) is at least one selected from acrylate, methacrylate, maleate, fumarate, and maleimide.

In one embodiment the thickness of said first intermediate article is from 100 μm to 30 mm.

In an alternative embodiment the thickness of said first intermediate article is from 20 to 100 mm.

In yet an alternative embodiment the thickness of said first intermediate article is from 0.05 micrometer to 100 micrometers. In one embodiment at least one unreacted group selected from an unreacted thiol group and an unreacted carbon-carbon double bond on said final article are reacted with further reactive groups to modify the properties of said final article. In one embodiment the reaction is performed in a distinct pattern. In one embodiment the reaction is performed inside a closed channel in a microfluidic system. This offers unique advantages by providing the possibility of modification of a surface inside a microfluidic system after its manufacture.

In one embodiment the compound comprising at least one thiol group is selected from the group consisting of pentaerythritol tetrakis(2-mercaptoacetate), pentaerythritol tetramercaptopropionate (PETMP); 2,4,6-trioxo-1,3,5-triazinatriy (triethyl-tris(3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, and trimethylolpropane tris(3-mercaptopropionate), and glycol dimercaptopropionate and pentaerythritol tetramercaptopropionate (PETMP). In one embodiment the compound comprising at least one carbon-carbon double bond is selected from the group consisting of triallyl-1,3,5-triazine-2,4,6(1H,3H,5H)-trione; Triethyleneglycol divinyl ether (TEGDVE); Trimethylolpropane diallyl ether; 1,6-heptadiyne; 1,7-octadiyne; bis-2,2-[4-(2-[norborn-2-ene-5-carboxylate]ethoxy)phenyl] propane (BPAEDN); 1,6-hexanediol di-(endo,exo-norborn-2-ene-5-carboxylate) (HDDN); trimethylolpropane tri-(norborn-2-ene-5-carboxylate) (TMPTN); pentaerythritoltri-(norborn-2-ene-5-carboxylate) (PTN3); pentaerythritol tetra-(norborn-2-ene-5-carboxylate) (PTN4); tricyclodecane dimethanol di-(endo, exo-norborn-2-ene-5-carboxylate) (TCDMDN); and di(trimethylolpropane) tetra-(norborn-2-ene-5-carboxylate) (DTMPTN). In one specific aspect, the ene monomer is Triallyl-1,3,5-triazine-2,4,6-trione (TATATO). In another specific aspect, the ene monomer is trimethylolpropane tri-(norborn-2-ene-5-carboxylate) (TMPTN).

In one embodiment at least one of said first intermediate article and said second article comprises at least one epoxide. In one embodiment the epoxide is selected from the group consisting of Tris(2,3-epoxypropyl) isocyanurate, Trimethylolpropane triglycidyl ether, Tris(4-hydroxyphenyl)methane triglycidyl ether,Poly(ethylene glycol)diglycidyl ether, Bisphenol A diglycidyl ether 1,2,5,6-Diepoxycyclooctane, 1,2,7,8-Diepoxyoctane, 1,2-Epoxy-5-hexene, 1,4-Cyclohexanedimethanol diglycidyl ether, 3,4-Epoxycyclohexylmethyl 3,4-epoxycyclohexanecarboxylate, 4,4'-Methylenebis(N,N-diglycidylaniline), Bis[4-(glycidyloxy)phenyl]methane, Bis [4-(glycidyloxy)phenyl]methane, Diglycidyl 1,2-cyclohexanedicarboxylate, N,N-Diglycidyl-4-glycidyloxyaniline, Neopentyl glycol diglycidyl ether, Resorcinol diglycidyl ether, Tris(4-hydroxyphenyl)methane triglycidyl ether. After a first cure, this offers a transform from very stiff (>1 GPa) to very soft (<10 MPa) within a very narrow temperature interval (20-30 degC). The OSTE polymers expose a high density of surface groups of thiol and epoxy, homogenously distributed over the surface. The density of surface groups can be controlled by the amount of off-stoichiometry. These surface groups can be utilized for covalent bond formation to other surfaces or free molecules. After a second curing process, the material has no leachable monomers and compared with OSTE without epoxy, higher glass transition temperatures and E-moduli are achievable. If the OSTE comprises polyethers, the first curing step creates a soft polymer that can be sealed to the substrate. A subsequent second curing process hardens the polymer and increases Tg as it consumes all or some of the remaining thiol and polyethers. The polyether groups exposed on the surface also have an "epoxy gluing" effect to most materials, e.g. metals and plastics.

If the OSTE contains epoxy groups, the first curing step creates a soft polymer that can be aligned and laminated with the other layers. A subsequent second curing process after the layers are laminated hardens the polymer and consumes all or some of the remaining excess of thiol groups and all or some of the polyether groups depending on the stoichiometric ratios. The polyether groups react to form covalent bonds over the interfaces to form a "monolithic" article.

In one embodiment where said intermediate article or said second article comprises epoxide, said epoxide reacts with at least one group selected from hydroxy-, amine, thiol, anhydride, cyanoacrylate, epoxy, and metal oxide containing compounds.

In one embodiment the reaction in step a) is initiated with an initiator. In one embodiment the reaction in step b) is initiated with an initiator.

In one embodiment reaction in step a) is initiated by at least one selected from actinic radiation, elevated temperature and ambient temperature, and wherein said reaction in step b) is initiated by at least one selected from actinic radiation, elevated temperature, and ambient temperature.

In one embodiment reactions in step a) and in step b) are initiated by actinic radiation, this is suitably carried out by using a photoactive initiator.

In an alternative embodiment the reaction in step a) is initiated by actinic radiation and wherein said reaction in step b) is initiated or accelerated by elevated temperature.

Examples of initiators that produce radicals include, but are not limited to, Rose Bengal (Aldrich), Darocur 2959 (2-hydroxy-1-[4-(hydroxyethoxy)phenyl]-2-methyl-1-propanone, D2959, Ciba-Geigy), Irgacure 651 (2,2-dimethoxy-2-phenylacetophenone, 1651, DMPA, Ciba-Geigy), Irgacure 184 (1-hydroxycyclohexyl phenyl ketone, 1184, Ciba-Geigy), Irgacure 907 (2-methyl-1-[4-(methylthio)phenyl]-2-(4-morpholinyl)-1-propanone, 1907, Ciba-Geigy), Camphorquinone (CQ, Aldrich), isopropyl thioxanthone (quantacure ITX, Great Lakes Fine Chemicals LTD., Cheshire, England), Kip 100 and 150 from Fratelli-Lamberti, Darocur 1173 2-Hydroxy-2-methyl-1-phenyl-propan-1-one (Ciba Specialty Chemicals), and phosphine oxides such as Irgacure Bis(2,4,6-trimethylbenzoyl)-phenylphosphineoxide 819 (Ciba). CQ is typically used in conjunction with an amine such as ethyl 4-N,N-dimethylaminobenzoate (4EDMAB, Aldrich) or triethanolamine (TEA, Aldrich) to initiate polymerization, for the anionic step a photolatent DBN from BASF is preferred. Photolatent DBN is typically used in conjunction with benzophenone or ITX.

Initiators for the thermally initiated or accelerated cure include but are not limited to DBN, DMP-30 and tertiary amines. In one embodiment the elevated temperature treatment was 70° C. during two hours. In one embodiment the radiation is used during 3-100 seconds. In one embodiment the effect is 6 mW/cm$^2$. In one embodiment the wavelength is 365 nm.

In one embodiment the final article is a microfluidic device comprising at least one closed channel.

In one embodiment the second article is an electric component. The first intermediate article is then used for packaging the electrical component.

In one embodiment Tg of said intermediate article is lower than the Tg for said second article. Examples of differences of Tg include but are not limited to 5, 7, 10, 12, 15, 20, and 30° C. After the first reaction in step a) a part of the reactive groups have reacted giving a certain Tg, and after another reaction in step b) more groups react giving a higher Tg of the final polymeric material in the second article. This for instance offers the advantage that the intermediate article in step a) is soft and adapts to the other article so that a better bonding is achieved.

In a second aspect there is provided an article manufactured by reacting a compound comprising at least two thiol groups and a compound comprising at least two carbon-carbon double bonds, with the proviso that the ratio (r1) in the reaction mixture between the number of thiol groups and the number of carbon-carbon double bonds fulfils one of: $0.5 \leq r1 \leq 0.9$ and $1.1 \leq r1 \leq 2$, to obtain a first intermediate article, wherein said first intermediate article comprises at least one unreacted group selected from an unreacted thiol group and an unreacted carbon-carbon double bond, and subsequently contacting said first intermediate article with a second article, wherein the surface of said second article at least partially comprises at least one chemical moiety selected from a thiol, and an electron deficient olefin for $0.5 \leq r1 \leq 0.9$ and at least one chemical moiety selected from vinyl, norbornene, allyl, alkene, alkyne, epoxy, isocyanate, N-hydroxy succinimide-groups, bromoacetyl, iodoacetyl, pyridyldisulfide, gold, platinum and silver for $1.1 \leq r1 \leq 2$ and reacting at least a part of said unreacted groups on said first intermediate article with chemical groups on said second article to obtain covalent bonds and forming a final article.

In one embodiment said electron deficient olefin in step b) is at least one selected from acrylate, methacrylate, maleate, fumarate, and maleimide.

The article described above can be manufactured according to any of the methods or embodiments outlined above.

The room temperature mechanical properties of OSTEs are tailored by simply adjusting the stoichiometric ratios of the monomers (and/or the monomer functionality). The OSTE polymers expose a high density of surface groups of either thiol or ene, homogenously distributed over the surface. The density of surface groups is controlled by the amount of off-stoichiometry. These surface groups can be utilized for covalent bond formation to other surfaces or free molecules.

The invention provides means for fabrication of micropatterned polymeric devices constructed from two or more separately fabricated micropatterned or unpatterned layers that are covalently bonded together in a process that follows after the fabrication of the separately fabricated layers. The covalent bonding process of the two or more separately fabricated micropattered layers is afforded by retained reactivity on the surfaces and/or in the bulk of the layers. Further, the surface chemistries are crossreactive so that the retained reactive chemistry in a first layer is reactive with a reactive chemistry retained in the second layer. In this manner, covalent bonding is achieved when surfaces are contacted with each other.

Monomers are difunctional or multifunctional thiol monomers or mixtures of monomers with an average functionality≥2 as the one component and an at least difunctional -ene (e.g. vinyl ether, norbornene and allyl ether) or mixtures of -ene monomers with an average functionality≥2 as the other component. By off-stoichiometry formulation, i.e. either the thiol or ene component in excess, surplus reactive groups are present throughout the polymeric network upon completion of the polymerization process.

In one embodiment, the invention provides compositions of thiol-ene liquid polymer precursors where a first layer is fabricated, either via micromolding or micromachining via actinic radiation, from a thiol-ene composition with a significant stoichiometric excess of either thiol or ene and a second layer which is fabricated, either via micromolding or micromachining via actinic radiation, from a thiol-ene composition with a significant stoichiometric excess of thiol or ene complementary to the first layer, i.e. if a thiol excess is used in the first layer then and ene excess is used for the second layer.

Ternary formulations, i.e. formulations containing three reactive groups, are useful in the invention as long as stoichiometric excess of at least one of the components is present after the fabrication of the micropatterned polymer layer.

In one embodiment the composition comprises thiol-ene-epoxy (oxirane).

In another embodiment the invention provides compositions of thiol-ene-epoxy liquid polymer precursors where a first layer is fabricated, either via micromolding or micromachining via actinic radiation, from a thiol-ene-epoxy composition with a significant stoichiometric excess of either thiol or ene and/or epoxy and a second layer which is fabricated, either via micromolding or micromachining via actinic radiation, from a thiol-ene composition with a significant stoichiometric excess of thiol or ene and/or epoxy complementary to the first layer, i.e. if a thiol excess is used in the first layer then and ene excess is used for the second layer, while the epoxy may be in excess in both formulations.

In another embodiment, epoxy polymerization is achieved by contact with a surface containing functional groups capable of initiating ionic, cationic or anionic, polymerization of epoxy groups on the surface as well as, via propagation, in the bulk of the polymeric material.

Other features and uses of the invention and their associated advantages will be evident to a person skilled in the art upon reading the description and the examples.

It is to be understood that this invention is not limited to the particular embodiments shown here. The following examples are provided for illustrative purposes and are not intended to limit the scope of the invention since the scope of the present invention is limited only by the appended claims and equivalents thereof.

EXAMPLES

Example 1

Mechanical Properties of Off-Stoichiometry Thiol-Ene Systems (OSTEs)

The thiol-ene systems polymerises via a step-wise reaction that enables a high control of the final properties of the final polymer. Off-stoichiometry thiol-ene formulations provide the ability to tailor polymers with a specific E-modulus and glass transition temperature by changing the off-stoichiometry ratio of the monomer functionality.

In table 1, the E-modulus (at 25° C. and 50° C.) and glass transition temperature of an off-stochiometry thiol-ene system consisting of pentaerythritol tetrakis[2-mercaptoacetate] PETMP and triallyl-1,3,5-triazine-2,4,6[1H,3H,5H]-trione TATATO monomers with a varying amount of excess thiol groups is shown. This polymer system will be denoted as "OSTE-Thiol" in the remainder of the examples. The off-stoichiometry is here defined as the ratio of thiol groups to allyl groups (thiol:allyl).

In table 2, the E-modulus (at 25° C. and 50° C.) and glass transition temperature of an example off-stochiometry thiol-ene system consisting of tris[2(3-mercaptopropionyloxy)ethyl]isocyanurate and triallyl-1,3,5-triazine-2,4,6[1H,3H,5H]-trione (TATATO) monomers with 30% allyl excess is shown. This polymer system will be denoted as "OSTE-Allyl" in the remainder of the document. The off-stoichiometry is here defined as the ratio of thiol groups to allyl groups (thiol:allyl).

In table 3, the E-modulus (at 25° C. and 50° C.) and glass transition temperature of an example off-stochiometry thiol-ene system consisting of tris[2(3-mercaptopropionyloxy)ethyl]isocyanurate and 1,1,2,2-Tetrakis(allyloxy)ethane monomers with a varying amount of excess allyl groups is shown. This polymer system will also be denoted as "OSTE-Allyl II" in the remainder of the document. The off-stoichiometry is here defined as the ratio of thiol groups to allyl groups (thiol:allyl).

In table 4, the E-modulus and glass transition temperature of an example off-stochiometry thiol-ene PDMS system consisting of the vinyl-functionalized polydimethylsiloxanes (AB109358, AB109359, AB109360, AB112958) and the dimethylsiloxane copolymer (4-6% Mercaptopropyl)methyl-siloxane) (AB113728) (all form ABCR GmbH, Germany) with a 30% off-stoichiometry ratio of thiol groups is shown. This polymer system will be denoted as "OSTE-PDMS" in the remainder of the document. The off-stoichiometry is here defined as the ratio of thiol groups to allyl groups (thiokallyl).

The mixing ratios for an OSTE-Thiol-PDMS (1.2:1) were:

| AB109358 | AB109359 | AB109360 | AB112958 | AB113728 |
|---|---|---|---|---|
| 800 mg | 100 mg | 300 mg | 100 mg | 462 mg |

To polymerize 1 mm thick films, 0.5% of a photo bleaching initiator (Lucirin TPO-L from BASF GmbH Germany) was added to all of the above formulations. The prepolymer formulations were all degassed in a vacuum chamber and irradiated with a standard table top UV-lamp equipped with a 365 nm wavelength band pass filter for 60 sec (EFOS Lite, EFOS, Ontario, Canada) at 4 mW/cm$^2$.

The mechanical properties, such as E-modulus and glass transition temperature were characterized using dynamic mechanical and thermal analysis (DMTA) (DMA Q800, PerkinElmer, Waltham, USA).

TABLE 1

Example OSTE-Thiol formulations.

| Off-stoichimoetry mixing ratio (thiol groups: allyl groups) | Name | E-modulus (@ 25° C.) | E-modulus (@ 50° C.) | Glass transition temperature (° C.) |
|---|---|---|---|---|
| 1:1 | OSTE Thiol (1:1) | 3100 MPa | 2900 MPa | 83 |
| 1.1:1 | OSTE Thiol (1.1:1) | 2900 MPa | 2700 MPa | 79 |
| 1.2:1 | OSTE Thiol (1.2:1) | 2400 MPa | 625 MPa | 60 |
| 1.5:1 | OSTE Thiol (1.5:1) | 1800 MPa | 80 MPa | 42 |
| 1.7:1 | OSTE Thiol (1.7:1) | 420 MPa | 40 MPa | 37 |
| 1.9:1 | OSTE Thiol (1.9:1) | 210 MPa | 11 MPa | 35 |
| 2.0:1 | OSTE Thiol (2.0:1) | 103 MPa | 8 MPa | 34 |

E-modulus and glass transition temperature of an example thiol-ene system consisting of tetrathiol and triallyl mixed with excess of thiol groups.

TABLE 2

Example OSTE-Allyl formulation.

| Off-stoichimoetry mixing ratio (thiol groups:allyl groups) | Name | E-modulus (@ 25° C.) | E-modulus (@ 50° C.) | Glass transition temperature (° C.) |
|---|---|---|---|---|
| 1:1.3 | OSTE Allyl (1:1.3) | 1800 MPa | 400 MPa | 66 |

E-modulus and glass transition temperature of an example off-stoichiometry thiol-ene system consisting of triallyl and trithiol mixed with an excess of allyl groups.

TABLE 3

Example of OSTE-Allyl formulations.

| Off-stoichimoetry mixing ratio (thiol groups:allyl groups) | Name | E-modulus (@ 25° C.) | E-modulus (@ 50° C.) | Glass transition temperature (° C.) |
|---|---|---|---|---|
| 1:1 | OSTE Allyl II (1:1) | 520 MPa | 16 MPa | 35 |
| 1:1.2 | OSTE Allyl II (1:1.2) | 200 MPa | 15 MPa | 29 |
| 1:1.6 | OSTE Allyl II (1:1.6) | 2.4 MPa | 2.3 MPa | 5 |

E-modulus and glass transition temperatures of an example off-stoichiometry thiol-ene system consisting of tetraallyl and trithiol with an excess of allyl groups.

TABLE 4

E-modulus and glass transition temperature of an OSTE polymer composed of vinyl-functionalized polydimethylsiloxanes (AB109358, AB109359, AB109360, AB112958) and the dimethylsiloxane copolymer (4-6% Mercaptopropyl)methylsiloxane) (AB113728) (all form ABCR GmbH, Germany) with a 20% off-stoichiometry ratio of thiol groups.

| Off-stoichimoetry mixing ratio (thiol groups:allyl groups) | Name | E-modulus (@ 25° C.) | E-modulus (@ 50° C.) | Glass transition temperature (° C.) |
|---|---|---|---|---|
| 1.2:1 | OSTE PDMS (1.2:1) | 0.45 | 0.45 | −36 |

Example 2

Mechanical Properties of Thiol-Ene-Epoxy Systems (OSTE+)

The OSTE polymers contain unreacted thiol or allyls groups after polymerisation. These affect the cross-linking density and thus mechanical properties and allow for covalent direct surface modification and bonding to other substrates and layers. By adding a third monomer, for example an epoxy, the resulting thiol-ene-epoxy system, hereafter called OSTE (+), can achieve a higher glass transition temperature, no leachable components, bonding to a very large number of substrates and monolithic laminated devices. By temporarily separating the curing processes into two steps the advantages of the OSTE (e.g. reactive surface groups and tunable mechanical properties) can be combined with a stiff end-material that has no leachable and a high glass transition temperature. First the thiol-ene system is cured to achieve a polymer with an excess of thiol groups that can be used as the standard OSTE polymers described above. Second, the excess thiol groups are cured with the epoxy groups.

In this experiment example polymer formulations of OSTE (+), which consisted of thiol (Pentaerythritol tetrakis(2-mercaptoacetate)), allyl (triallyl-1,3,5-triazine-2,4,6(1H,3H,5H)-trione) and epoxy (Tris(2,3-epoxypropyl)isocyanurate) monomers. In table 4, The stoichiometric ratios of the OSTE (+) was varied with respect to the thiol excess after the first cure (thiol groups:allyl groups: epoxy groups) from a 20% excess of thiols after the first cure (1.2:1:0.2) to a 100% excess of thiols after the first cure (2:1:1). In the dual cure process employed, the thiol and allyl react readily via an alternating radical copolymerization initiated via Lucirin TPO (BASF) and UV-light, while the thiol and epoxy react via an alternating anionic mechanism initiated by DBN (1,5-diazabicyclo [4.3.0]non-5-ene).

In the dual cure process of the OSTE(+) prepolymer, the first RT UV-initiated curing step (medium pressure mercury lamp equipped with a 365 nm bandpass filter, 6 mW/cm² for 10 s) consumes all allyl and an equal amount of thiols resulting in a partially polymerized soft material. At this stage, the material contains residual thiols groups that are in excess with relation to the allyls and epoxy groups that have reacted to an insignificant extent. This intermediate product is ideal for direct dry bonding to many kinds of substrates such as silicon and glass since it complies to irregularities on the substrate and is able to form covalent epoxy and thiol links upon further cure. The second thermal cure (70° C., 2 hrs) produces materials with high glass transition temperature and no leachable components through the anionic polymerization, of remaining thiol and epoxy as evidenced by the disappearance of the thiol peak in a Raman spectral analysis. The epoxy cure also affords efficient bonding to many different substrate surfaces (example 6).

TABLE 5

Ternary systems of OSTE(+) with the thiol monomer Pentaerythritol tetrakis (2-mercaptoacetate), the allyl monomer triallyl-1,3,5-triazine-2,4,6(1H,3H,5H)-trione and the epoxy monomer Tris(2,3-epoxypropyl) isocyanurate) monomers.

| Part of each functional group allyl/epoxy/ thiol thiol:ally: epoxy | Name | E-modulus (@ 25 deg C.) | E-modulus (@ 70 deg C.) | Glass transition temperature |
|---|---|---|---|---|
| 1.2/1/0.2 | OSTE(+) (1.2/1/0.2) | 2252 | 1584 | 90 |
| 1.4/1/0.4 | OSTE(+) (1.4/1/0.4) | 2472 | 2191 | 115 |
| 1.6/1/0.6 | OSTE(+) (1.6/1/0.6) | 3091 | 2247 | 101 |
| 1.8/1/0.8 | OSTE(+) (1.8/1/0.8) | 3081 | 1733 | 96 |
| 2/1/1 | OSTE(+) (2/1/1) | 2316 | 1905 | 103 |

The mixing ratios were chosen as to achieve a fully cured material after the second polymerisation of thiols and epoxies. Samples were 1 mm. The table lists mechanical properties after both curing steps.

Example 3

Direct Surface Modification

The capability of direct surface modification using the available thiol groups on OSTE-surfaces was demonstrated by permanently modifying the water contact angle. Solutions of allyl or thiol functionalized grafting molecules were prepared in a solvent. As a hydrophilic modifier end-functionalized PEG-allyls and PEG-thiols (MW 5 kDa) was synthesized, which were diluted as 10% w/w solutions in 2-propanol with 0.5% w/w ITX photoinator (Firstcure® ITX, Albemarle Corp., Baton Rouge, USA). As hydrophobic modifiers we utilized allyl functionalized PDMS (vinylmethylsiloxane homopolymer, linear, AB109397) and thiol functionalized PDMS (poly(mercaptopropyl)methylsiloxane, AB113729), both from ABCR GmbH, Germany. The PDMS molecules where diluted as 10% w/w solutions in toluene with 0.5% w/w ITX photoinitator. To change the wetting of an OSTE with thiol excess, the solutions of allyl-functionalized molecules were used and to change the wetting of an OSTE with allyl excess, the solutions of thiol-functionalized molecules were used. The solutions were applied to their corresponding OSTE-polymer, a thin polycarbonate film was applied to avoid oxygen inhibition and the surfaces were irradiated for 60 sec with a table top UV-lamp (EFOS Lite, EFOS, Ontario, Canada) 4 mW/cm² at 365 nm wavelength. The surface was thoroughly washed with solvent and dried under a stream of nitrogen. Finally, the contact angle was measured on the modified surface.

Contact angles were measured using the sessile drop method. In Table the different contact angles on modified and unmodified OSTE polymers are listed. In their unmodified state, the OSTE-Thiol (1.9:1) and OSTE-Allyl (1:1.3) have contact angles of 76° and 68° respectively, similar to thermoplastics such as PMMA and PC. By grafting PEG or PDMS on the surface following the above-described process, their wetting properties can be changed. The large change in contact angle indicates a high yield grafting reaction and an abundance of reactive sites on the surface. In contrast to the small multifunctional monomers used in the OSTE-Thiol and OSTE-Allyl materials, the OSTE-Thiol-PDMS has only 5% thiol groups along its siloxane chains, and the density of unreacted groups on the surface is therefore not high enough to have an impact on macroscopic properties such as the contact angle. Instead a first layer of the allyl functionalized PDMS, mixed as above, is grafted to increase the number of reactive sites. These long PDMS chains react with one or more thiols on the surface and create molecular yarn of siloxane chains with several unreacted allyl groups. In a second step, the thiol functionalized PEG reacts with the allyls to create a PEG grafted surface. This procedure results in a clearly visible contact angle change.

TABLE 6

Contact angle after direct grafting on some OSTE-polymers

| Material | Modification | Contact angle (deg) |
|---|---|---|
| OSTE-Thiol (1.9:1) | — | 76 +− 4 |
| OSTE-Thiol (1.9:1) | AB109397 (vinyl PDMS) | 97 +− 3 |
| OSTE-Thiol (1.9:1) | mono allyl poly(ethylenglycol) MW 5 kDa | 48 +− 4 |
| OSTE-Allyl (1.9:1) | — | 68 +− 3 |
| OSTE-Allyl (1:1.3) | AB113729 (thiol PDMS) | 77 +− 5 |
| OSTE-Allyl (1:1.3) | mono thiol poly(ethyleneglycol) | 35 +− 4 |
| OSTE-Thiol-PDMS (1.2:1) | — | 102 |
| OSTE-Thiol-PDMS (1.2:1) | AB109397 (vinyl PDMS) | 86 |
| OSTE-Thiol-PDMS (1.2:1) | AB109397 (vinyl PDMS) and mono thiol poly(ethyleneglycol) | 49 +− 6 |

Example 4

Patterning of Surface Modifications Using a Stencil Mask

Since the reaction can be UV-initiated, the grafting can be patterned using, for example, a stencil mask. Here the creation of different wetting properties on different parts of the chips is demonstrated.

Hydrophobic retention valves were demonstrated by patterning hydrophobic molecules on the surface of two OSTE-polymers (OSTE-Thiol and OSTE-Allyl) that were subsequently UV-bonded to each other. We first manufactured a 0.5 mm thick channel layer in the OSTE-Thiol (1.9:1) polymer. The channel layer has three straight channels, each 200 µm wide and 30 µm high. Holes were drilled at each end of the channels as inlets and outlets. A flat 0.5 mm thick bottom layer was also fabricated in the stiff OSTE-Allyl (1:1.3). By aligning a stencil mask with transparent openings over some parts of the channels, the channel layer was patterned with allyl functionalized PDMS (vinylmethylsiloxane homopolymer, linear, AB109397), CA=97° (prepared as above). The same stencil mask was also aligned to the bottom layer which was modified with thiol functionalized PDMS (poly(mercaptopropyl)methylsiloxane, AB113729), CA=77° (prepared as above). Finally the layers were aligned, heated to 35° C. to soften the OSTE-Thiol (1.9:1) and maximize the contact area between the layers. The layers were subsequently exposed to unfiltered UV-light to initiate the covalent thiol-ene coupling without initiator. Water drops were placed at the drilled inlet holes. The liquid slowly filled all three channels by capillary action until it reached the areas modified with the hydrophobic molecules, where it stopped.

Example 5

Direct Bonding to Another OSTE-Polymer with the Opposite Excess Groups

Two layers of OSTE polymers with different excess groups can be covalently bonded when exposed to UV-light. Since there is no initiator available in the already polymerized material, UV-light with a wavelength of 250 nm was used to initiate the thiol-ene polymerization reaction between the thiol and the allyl groups at the interface. Here, an OSTE-Allyl (1:1.3) was bonded to an OSTE-Thiol (1.9:1).

Perfect contact is always important for a high yield in the bond formation and is usually a problem using two stiff substrates. The OSTE layers have a very narrow glass transition temperature and remain stiff up until a very well defined temperature when then quickly soften. This feature is used to achieve perfect contact during bonding.

The layers were aligned, brought into contact and heated to 35° C. At this temperature the OSTE Thiol (1.9:1) polymer softens ($T_g$=35) and conforms to micro- and nano irregularities on the surface of the harder OSTE-Allyl (1:1.3)

Next the layers were exposed to UV-light (EFOS Lite, unfiltered medium pressure Hg spectrum). The exposure time varied from 5 min to 10 min because of the low light intensity at 254 nm wavelength produced by the medium pressure mercury lamp. The bond strength was tested by a blister test, in which pressurized air is pneumatically connected to a 2 mm diameter cavity between the bonded layers. When ramping the differential pressure, the layers withstood up to 4 bars, where after the bulk material ruptured, indicating a bond strength higher than the material integrity, and surpassing the needs of most microfluidic applications.

Example 6

Bonding to Biofunctionalised Surfaces

An OSTE material adapted for a biocompatible bonding process to sensors and substrates was developed. It consists of the OSTE Thiol (1.7:1) polymer, which has a glass transition temperature of 37° C. and is stiff at room temperature (200 MPa) but softens in a narrow interval close to 37° C. to 30 MPa which allows for conformal contact to micro- and nano irregularities on the substrate. The excess thiol groups can now spontaneously react with many common surface coating (e.g. isocyanates, activated esters, epoxy groups etc).

In one example a micropatterned OSTE Thiol (1.7:1), called "Biosticker", was used to integrate a microfluidic layer to microarrays. Integration of microfluidics with microarrays provides: multiplexing, improved mass transport, faster reaction times and elimination of cross-talk. The Biosticker, provides a rapid, one-step, biocompatible bonding process to integrate microfluidics with different microarray surfaces.

A micropatterned Biosticker layer, containing a 9×9 mm² detection chamber of 30 µm height (aspect ratio>1:300) was manufactured by casting the OSTE-polymer on a 4" silicon/SU-8 wafer mold, followed by a planarization to 500 µm thickness using a polycarbonate carrier. The prepolymer was cured using a table-top UV-lamp (365 nm, 4 mW/cm², EFOS Lite, EXFOS) for 30 seconds. The cured polymer sheet was released from the mold and carrier by heating the stack to 45° C. on a hotplate, where after access holes were drilled and the sheet was cut into polymer layer of 15×15 mm². Microarrays were prepared from silicon chips (15×15 mm²) coating with a surface exposing active esters (N-hydroxy succinimide, NHS), which is a common linker to proteins and DNA. The Biosticker was separately heated to 40° C. on a hotplate and thereafter lightly pressed against the microarray before it cooled down. The heated biosticker conformed perfectly to the surface of the microarray and the thiol-groups could react with the activated esters (NHS) in the receptor linker layer to form a covalent bond.

When the Biosticker cooled down to room temperature it formed a covalently bonded, hard plastic cover with an integrated microfluidic network on the microarray. The fluidic ports were connected to a pump and deactivation was performed inside the chip using ethanolamine solution. Two bioassays were run: 1) a fluorescent protein experiment with spotted β-lactoglobulin detecting 1 ng/ml of anti β-lactoglobulin antibody, and 2) a DNA hybridization test using spotted 23 mer 5'-amine modified oligonucleotides and target complementary oligonucleotide (1 µM). After completing the assay, the Biostickers were peeled off by heating the microarrays to 45° C.

The results of both the protein assay and the DNA hybridization tests, measured with a fluorescent scanner (Scan Array, Perkin Elmer), showed excellent signal and spot homogeneity, demonstrating the potential for using the Biostickers to bond to already biofunctionalised surfaces and avoid the need for complex bonding processes, unpractical clamping or suboptimal materials.

In another experiment the Biosticker was bonded in the precise same manner as described above to a microarray exposing epoxy groups (Thermo Scientific prodnr: 82052) producing a similar leak-tight seal by reacting the free thiol groups on the Biosticker surface with the epoxy groups on the microarray surface.

Example 7

Bonding to Other Surfaces with OSTE and OSTE(+)

The OSTE-polymers can also be directly bonded to surfaces that are unmodified, i.e. the native material. During bonding the OSTE-polymer may be heated to its glass transition temperature to soften the polymer layer and make it conform to micro-irregularities of the substrate surface. This increases the bond area and is essential for creating a strong bond between two hard substrates. The OSTE(+) can be used to bond to an even wide range of substrates from metals to plastics.

OSTE to Gold Surfaces

The excess thiol groups of the OSTE-polymer can directly form a bond to gold surface. A film of the OSTE-Thiol (1.9:1) was bonded to a clean gold surface at 37° C. A burst pressure measurement was performed on a 15 mm diameter and 1 mm thick OSTE-Thiol (1.9:1) sample bonded to a gold piece with a 2 mm diameter hole. The bond was found to withstand up to 2 bars pressure.

OSTE(+) to Aluminum Surfaces

A burst pressure measurement was performed on a 15 mm diameter and 1 mm thick OSTE(+) (1.4:1:0.4) (thiol:allyl:epoxy) sample bonded to an aluminum piece with a 2 mm diameter hole. The assembly was mounted in a holder, submerged in boiling water, and the inlet air pressure was increased until bond failure was detected. The bond was found to withstand up to 3 bars pressure at 100° C.

OSTE(+) to Silicon Surfaces

A burst pressure measurement was performed on a 15 mm diameter and 1 mm thick OSTE(+) (1.4:1:0.4) sample bonded to a clean silicon piece with a 2 mm diameter hole. The assembly was mounted in a holder, and the inlet air pressure was increased until bond failure was detected. The bond was found to withstand over 4.4 bars pressure, which was the limit of the pressure set-up.

OSTE(+) to OSTE(+)

Two OSTE(+) (1.4:1:0.4) layers, 1 mm thick, were first separately casted using UV-curing 6 mW/cm2 for 10 s to react all allyl groups with thiol groups and leave an equal amount of unreacted thiol and epoxy groups. The layers were subsequently laminated and thermally cured for 2 hrs at 70° C. The layers could not be separated and was monolithically bonded.

Example 8

Extractable Material

Leaching in chloroform was also performed to determine the amount of extractable material in the off-stoichiometry polymers. 1 cm×1 cm×1 mm pieces of polymers were prepared as in Example 1. The pieces were weighted, immersed in chloroform for 24 hours, dried in a vacuum oven and weighted again.

TABLE 7

Amount of extractable material in some OSTE and OSTE(+) formulations

| | Extractable in chloroform | Extractable in water |
| --- | --- | --- |
| OSTE-Thiol (90%) | 8 +− 2% | 0% |
| OSTE Allyl (30%) | 2 +− 1% | 0% |
| OSTE PDMS (20%) | 10 +− 2% | 0% |
| OSTE(+) (1/2/1) | 0.22 ± 0.05% | 0% |

Example 9

Micromolded Parts

We showed a solution for integrated chip-to-world tube connectors. The ability of the OSTE-family of polymers to simplify the entire rapid prototyping cycle was demonstrated by machining fluidic connectors in the OSTE-Allyl (1:1.3) and dry-bond them to OSTE-Thiol (1.9:1) channel layers using UV-light under room temperature. A mould cavity was created by pouring and curing PDMS on a NanoPort™ connector. OSTE-Allyl (1:1.3) was injected into the PDMS mold cavity and cured using a table-top UV-lamp (365 nm, 4 mW/cm2, EFOS Lite, EXFOS) for 30 seconds. The PDMS mould was removed and the OSTE-Allyl (1:1.3) replicated connector was threaded to fit standard 6-32 coned fittings (UNC 3.5 mm). The ports were aligned to the drilled inlet holes in the OSTE-Thiol (1.9:1), heated to 35° C. to improve contact, and UV-bonded for 5 min with unfiltered UV (EFOS Lite, standard lamp without filter).

The invention claimed is:

1. A method of manufacturing an article, said method comprising the steps of:
   a) reacting a compound comprising at least two thiol groups and a compound comprising at least two carbon-carbon double bonds to obtain a first intermediate article, wherein ratio ($r_1$) of number of thiol groups and number of carbon-carbon double bonds is selected from the group consisting of $0.5 \leq r_1 \leq 0.9$ and $1.1 \leq r_1 \leq 2$, and wherein said first intermediate article comprises at least one unreacted group selected from the group consisting of an unreacted thiol group and an unreacted carbon-carbon double bond;

b) contacting said first intermediate article with a second article, wherein when the ratio ($r_1$) is $0.5 \leq r_1 \leq 0.9$, the surface of said second article at least partially comprises at least one chemical moiety selected from the group consisting of a thiol and an electron deficient olefin, wherein said electron deficient olefin is at least one electron deficient olefin selected from the group consisting of acrylate, methacrylate, maleate, fumarate, and maleimide; and wherein when the ratio ($r_1$) is $1.1 \leq r_1 \leq 2$, the surface of said second article at least partially comprises at least one chemical moiety selected from the group consisting of vinyl, norbornene, allyl, alkene, alkyne, vinyl acetate, vinyl naphthalene, vinyl benzene, ethylenically unsaturated compounds, epoxy, isocyanate, N-hydroxy succinimide-groups, bromoacetyl, iodoacetyl, pyridyldisulfide, gold, platinum, and silver, and reacting at least a part of said unreacted groups on said first intermediate article with chemical groups on said second article to obtain covalent bonds and to form a final article.

2. The method according to claim 1, wherein said second article comprises at least one unreacted group selected from the group consisting of an unreacted thiol group and an unreacted carbon-carbon double bond, and wherein said second article is manufactured by reacting a compound comprising at least two thiol groups and a compound comprising at least two carbon-carbon double bonds, wherein ratio ($r_2$) of number of thiol groups and number of carbon-carbon double bonds is $1.1 \leq r_2 \leq 2$ when the ratio ($r_1$) is $0.5 \leq r_1 \leq 0.9$, and the ratio ($r_2$) is $0.5 \leq r_2 \leq 0.9$ when the ratio ($r_1$) is $1.1 \leq r_1 \leq 2$.

3. The method according to claim 1, wherein in step a) said compound comprising at least two thiol groups and said compound comprising at least two carbon-carbon double bonds are reacted with an initiator.

4. The method according to claim 1, wherein said first intermediate article is from 100 μm to 30 mm thick.

5. The method according to claim 1, wherein said first intermediate article is from 10 μm to 100 mm thick.

6. The method according to claim 1, wherein said first intermediate article is from 0.05 μm to 10 μm thick.

7. The method according to claim 1, wherein said final article has at least one unreacted group, wherein said at least one unreacted group is selected from the group consisting of an unreacted thiol group and an unreacted carbon-carbon double bond, and wherein said at least one unreacted group on said final article is reacted with further reactive groups to modify the properties of said final article.

8. The method according to claim 7, wherein said reaction is performed in a distinct pattern.

9. The method according to claim 7, wherein said reaction is performed inside a closed channel in a microfluidic system.

10. The method according to claim 1, wherein said compound comprising at least one thiol group is selected from the group consisting of pentaerythritol tetrakis (2-mercaptoacetate), pentaerythritol tetramercaptopropionate (PETMP); 1-octanethiol; butyl 3-mercaptopropionate; 2,4,6-trioxo-1,3,5-triazina-triy (triethyl-tris (3-mercapto propionate); 1,6-Hexanedithiol; 2,5-dimercaptomethyl-1,4-dithiane, pentaerythritol tetramercaptoacetate, trimethylolpropane trimercaptoacetate, 2,3-dimercapto-1-propanol, 2,3-(dimercaptoethylthio)-1-mercaptopropane, 1,2,3-trimercaptopropane, toluenedithiol, xylylenedithiol, 1,8-octanedithiol, trimethylolpropane tris(3-mercaptopropionate), glycol dimercaptopropionate, and pentaerythritol tetramercaptopropionate (PETMP).

11. The method according to claim 1, wherein said compound comprising at least one carbon-carbon double bond is selected from the group consisting of triallyl -1,3,5-triazine-2,4,6(1H,3H,5H)-trione; triethyleneglycol divinyl ether (TEGDVE); trimethylolpropane diallyl ether; 1,6-heptadiyne; 1,7-octadiyne; bis-2,2-[4-(2-[norborn-2-ene-5-carboxylate]ethoxy)phenyl]propane (BPAEDN); 1,6-hexanediol di-(endo,exo-norborn-2-ene-5-carboxylate) (HDDN);

trimethylolpropane tri-(norborn-2-ene-5-carboxylate) (TMPTN);

pentaerythritoltri-(norborn-2-ene-5-carboxylate) (PTN3);

pentaerythritol tetra-(norborn-2-ene-5-carboxylate) (PTN4);

tricyclodecane dimethanol di-(endo, exo-norborn-2-ene-5-carboxylate) (TCDMDN); and di(trimethylolpropane) tetra-(norborn-2-ene-5-carboxylate) (DTMPTN).

12. The method according to claim 1, wherein at least one of said first intermediate article and said second article comprises at least one epoxide.

13. The method according to claim 12, wherein said epoxide is selected from the group consisting of Tris(2,3-epoxypropyl) isocyanurate, trimethylolpropane triglycidyl ether, tris(4-hydroxyphenyl)methane triglycidyl ether,poly (ethylene glycol) diglycidyl ether, bisphenol A diglycidyl ether 1,2,5,6-diepoxycyclooctane, 1,2,7,8-diepoxyoctane, 1,2-Epoxy-5-hexene, 1,4-cyclohexanedimethanol diglycidyl ether, 3,4-epoxycyclohexylmethyl 3,4-epoxycyclohexanecarboxylate, 4,4'-methylenebis(N,N-diglycidylaniline), bis [4-(glycidyloxy)phenyl]methane, bis[4-(glycidyloxy)phenyl]methane, diglycidyl 1,2-cyclohexanedicarboxylate, N,N-diglycidyl -4-glycidyloxyaniline, neopentyl glycol diglycidyl ether, resorcinol diglycidyl ether, and tris(4-hydroxyphenyl)methane triglycidyl ether.

14. The method according to claim 12, wherein said epoxide reacts with at least one group selected from the group consisting of hydroxy-, amine, thiol, anhydride, cyanoacrylate, epoxy, and metal oxide containing compounds.

15. The method according to claim 1, wherein said reaction in step a) is initiated by at least one initiator selected from the group consisting of actinic radiation, elevated temperature, and ambient temperature; and wherein said reaction in step b) is initiated by at least one initiator selected from the group consisting of actinic radiation, elevated temperature, and ambient temperature.

16. The method according to claim 1, wherein said final article is a microfluidic device comprising at least one closed channel.

17. The method according to claim 1, wherein said second article is an electric component.

18. The method according to claim 1, wherein said first intermediate article has a lower glass transition temperature (Tg) than the glass transition temperature (Tg) for said second article.

19. An article manufactured by reacting a compound comprising at least two thiol groups and a compound comprising at least two carbon-carbon double bonds to obtain a first intermediate article, wherein ratio ($r_1$) of number of thiol groups and number of carbon-carbon double bonds is selected from the group consisting of $0.5 \leq r_1 \leq 0.9$ and $1.1 \leq r_1 \leq 2$, and wherein said first intermediate article comprises at least one unreacted group selected from the group consisting of an unreacted thiol group and an unreacted carbon-carbon double bond; and subsequently contacting said first intermediate article with a second article, wherein when the ratio ($r_1$) is $0.5 \leq r_1 \leq 0.9$, the surface of said second article at least partially comprises at least one chemical moiety selected from the group consisting of a thiol and an electron deficient olefin, wherein said electron deficient olefin is at least one electron deficient olefin selected from the group consisting of acrylate, methacrylate, maleate, fumarate, and maleimide; and wherein when the ratio $(r_1)$ is $1.1 \leq r_1 \leq 2$, the surface of said second article at least partially comprises at least one chemical moiety selected from the group consisting of vinyl, norbornene, acrylamide, cyanoacrylate, allyl, alkene, alkyne, epoxy, isocyanate, N-hydroxy succinimide, bromoacetyl, iodoacetyl, pyridyldisulfide, gold, platinum, and silver, and reacting at least a part of said unreacted groups on said first intermediate article with chemical groups on said second article to obtain covalent bonds and to form a final article.

* * * * *